(12) United States Patent
Derner (10) Patent No.: US 10,943,624 B1
(45) Date of Patent: Mar. 9, 2021

(54) COUNTERING DIGIT LINE COUPLING IN MEMORY ARRAYS

(71) Applicant: Micron Technology, Inc., Boise, ID (US)

(72) Inventor: Scott J. Derner, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/541,940

(22) Filed: Aug. 15, 2019

(51) Int. Cl.
*G11C 7/02* (2006.01)
*G11C 7/08* (2006.01)
*G11C 7/12* (2006.01)
*G11C 8/08* (2006.01)

(52) U.S. Cl.
CPC .............. *G11C 7/02* (2013.01); *G11C 7/08* (2013.01); *G11C 7/12* (2013.01); *G11C 8/08* (2013.01)

(58) Field of Classification Search
CPC .... G11C 7/02; G11C 7/12; G11C 7/08; G11C 8/08
See application file for complete search history.

(56) References Cited

U.S. PATENT DOCUMENTS

| | | | |
|---|---|---|---|
| 6,735,103 B2* | 5/2004 | Kirsch | G11C 7/18 365/230.03 |
| 7,512,025 B2* | 3/2009 | Yoon | G11C 7/04 365/203 |
| 7,580,314 B2* | 8/2009 | Kim | G11C 7/02 365/149 |
| 7,662,693 B2 | 2/2010 | Bhattacharyya | |
| 7,875,529 B2 | 1/2011 | Forbes et al. | |
| 8,085,611 B2* | 12/2011 | Lin | G11C 16/28 365/207 |
| 8,264,900 B2* | 9/2012 | Lin | G11C 16/28 365/207 |
| 8,274,777 B2 | 9/2012 | Kiehlbauch | |
| 8,477,526 B2* | 7/2013 | Rountree | H01L 29/06 365/149 |
| 8,737,152 B2* | 5/2014 | Kim | G11C 7/12 365/203 |
| 8,854,909 B2* | 10/2014 | Kim | G11C 7/12 365/203 |
| 9,767,919 B1* | 9/2017 | He | G11C 29/18 |
| 2008/0056041 A1* | 3/2008 | Liaw | G11C 7/18 365/208 |
| 2019/0067206 A1* | 2/2019 | Bedeschi | G11C 11/409 |

* cited by examiner

Primary Examiner — Tri M Hoang
(74) Attorney, Agent, or Firm — Brooks, Cameron & Huebsch, PLLC (57) ABSTRACT

Apparatuses and methods can be related to countering noise at a memory array. Countering noise can include enable switches to connect third digit lines of the first array adjacent to the respective first digit lines to fourth digit lines of the second array adjacent to the reference digit lines such that the reference digit lines experience a same amount of digit line coupling noise as the first digit lines experience.

20 Claims, 6 Drawing Sheets

---

ENABLING A FIRST DIGIT LINE AND A WORD LINE OF A FIRST MEMORY ARRAY TO DUMP A CHARGE STORED BY A MEMORY CELL COUPLED TO THE FIRST DIGIT LINE AND THE WORD LINE ONTO A DIGIT LINE, WHERE IN THE FIRST DIGIT OF THE FIRST MEMORY ARRAY IS COUPLED TO A SENSING COMPONENT WHICH IS COUPLED TO A FIRST DIGIT LINE OF A SECOND MEMORY THAT SERVES AS A REFERENCE DIGIT LINE FOR SENSING THE FIRST MEMORY CELL ⟶ 552

COMPENSATING FOR DIGIT LINE TO DIGIT LINE COUPLING BETWEEN THE FIRST DIGIT LINE AND A PLURALITY OF DIGIT LINES OF THE FIRST MEMORY ARRAY IN ASSOCIATION WITH SENSING THE MEMORY CELL BY CONNECTING RESPECTIVE DIGIT LINES OF THE SECOND MEMORY ARRAY SUCH THAT A REFERENCE VOLTAGE OF THE REFERENCE DIGIT LINE EXPERIENCES A SAME DIGIT LINE TO DIGIT LINE COUPLING EFFECT AS THE DIGIT LINE TO DIGIT LINE COUPLING EFFECT EXPERIENCED BY THE FIRST DIGIT LINE ⟶ 554

ENABLING A FIRST DIGIT LINE AND A WORD LINE OF A FIRST MEMORY ARRAY TO DUMP A CHARGE STORED BY A MEMORY CELL COUPLED TO THE FIRST DIGIT LINE AND THE WORD LINE ONTO A DIGIT LINE, WHERE IN THE FIRST DIGIT OF THE FIRST MEMORY ARRAY IS COUPLED TO A SENSING COMPONENT WHICH IS COUPLED TO A FIRST DIGIT LINE OF A SECOND MEMORY THAT SERVES AS A REFERENCE DIGIT LINE FOR SENSING THE FIRST MEMORY CELL ⟵ 552

COMPENSATING FOR DIGIT LINE TO DIGIT LINE COUPLING BETWEEN THE FIRST DIGIT LINE AND A PLURALITY OF DIGIT LINES OF THE FIRST MEMORY ARRAY IN ASSOCIATION WITH SENSING THE MEMORY CELL BY CONNECTING RESPECTIVE DIGIT LINES OF THE SECOND MEMORY ARRAY SUCH THAT A REFERENCE VOLTAGE OF THE REFERENCE DIGIT LINE EXPERIENCES A SAME DIGIT LINE TO DIGIT LINE COUPLING EFFECT AS THE DIGIT LINE TO DIGIT LINE COUPLING EFFECT EXPERIENCED BY THE FIRST DIGIT LINE ⟵ 554

COUNTERING DIGIT LINE COUPLING IN MEMORY ARRAYS

TECHNICAL FIELD

The present disclosure relates generally to memory, and more particularly to apparatuses and methods associated with countering digit line coupling in memory arrays.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory is also utilized as volatile and non-volatile data storage for a wide range of electronic applications. including, but not limited to personal computers, portable memory sticks, digital cameras, cellular telephones, portable music players such as MP3 players, movie players, and other electronic devices. Memory cells can be arranged into arrays, with the arrays being used in memory devices.

Increasing memory density (e.g., the quantity of bits stored per unit surface area on a chip) is often a desirable goal of memory manufacturers. However, as the size of memory cells and the spacing between them decreases, coupling noise between components such as digit lines, word lines, transistors, and/or capacitors can increase. As an example, capacitive coupling between digit lines can lead to a decreased sense margin available to sense amplifiers used to determine the data values stored by respective memory cells.

DETAILED DESCRIPTION

The present disclosure includes apparatuses and methods related to countering digit line to digit line coupling noise in memory arrays. An apparatus that experiences digit line to digit line coupling noise can include a plurality of array, sensing circuitry, and control circuitry among other components. The sensing components can be coupled to respective first digit lines of a first array of memory cells and to respective second digit lines of a second array of memory cells. The respective second digit lines can serve as reference digit lines for sensing memory cells of the first array. The control circuitry can be coupled to the sensing components and can be configured to, in association with sensing data values stored in memory cells coupled to a word line and to the respective first digit lines, enable switches to connect third digit lines of the first array adjacent to the respective first digit lines to fourth digit lines of the second array adjacent to the reference digit lines such that the reference digit lines experience a same amount of digit line coupling noise as the first digit lines experience.

Sensing memory cells can include activating a WL to turn on the access transistors corresponding to a selected row of memory cells. Activating a selected row of memory cells can allow the charge stored on the memory cells to be "dump" onto the respective digit lines. A sense amplifier that is coupled to each digit line can be used to amplify a differential voltage signal between the digit line and a reference digit line to which the sense amplifier is coupled. The reference digit line can be biased at a particular voltage such as Vcc/2, but digit line to digit line (DL-DL) coupling can alter the voltage on the digit line. The amount of change (e.g., pull down of the voltage on the digit line (DL)) can depend on the data pattern (e.g., the data values stored in neighboring cells). For example, a data pattern can include a "1" in a sea of "0s" such that the amount of changes can be greatest as compared to different data patterns.

The changed voltage on the digit line due to DL-DL coupling can reduce the voltage difference between the DL and the reference DL, which can make sensing the cell more difficult. The reduced voltage difference between a DL and a corresponding reference DL can degrade the signal available to the sense amplifier. It may be beneficial to reduce the degradation (e.g., change in voltage) due to the DL-DL coupling to enable the sense amplifier to latch a data value.

The voltage difference due to DL-DL coupling can be restored by introducing noise to the reference digit line. The among of noise introduced to the reference DL can be substantially equal to the noise experienced by the target digit line due to DL-DL coupling. Noise can be introduced to the reference DL using switches that couple DLs adjacent to the target DL to DLs adjacent to the reference digit line. Introducing noise to both the target DL and the reference DL can retain a same voltage difference as compared to the voltage different of the target DL and the reference DL if neither experienced noise.

As used herein, noise describes the introduction of a charge or charge loss from a digit line. For example, the introduction of a charge to a digit line can include the introduction of a charge that did not originate from a memory cell coupled to the digit line. The loss of charge can include charge being lost from a digit line to a different digit line. In many instances, both a digit line that loses charge and a different digit line that gains the charge experience noise.

Digit lines can be adjacent to each other if the digit lines are physically located next to each other in a memory array.

A row of memory cells can be next to a different row of memory cells if the addresses of the rows are consecutive and/or if there are no other rows between the adjacent rows. Memory cells may be adjacent to each other if the memory cells are coupled to rows that are adjacent to each other.

As used herein, "a number of" something can refer to one or more of such things. For example, a number of memory devices can refer to one or more memory devices. A "plurality" of something intends two or more. Additionally, designators such as "N," as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

Figure 1:
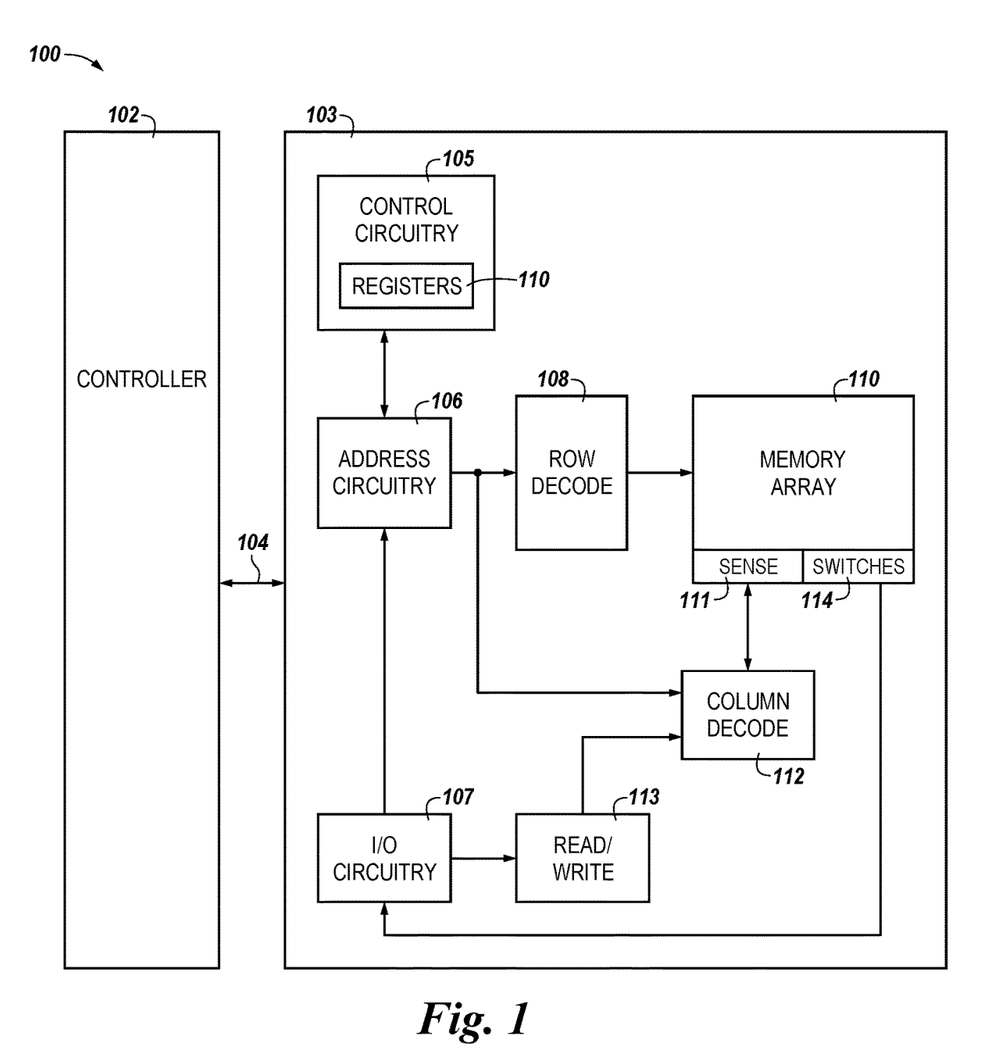
FIG. 1 is a block diagram of an apparatus in the form of a computing system including a memory device in accordance with a number of embodiments of the present disclosure.

FIG. 1 is a block diagram of an apparatus in the form of a computing system 100 including a memory device 103 in accordance with a number of embodiments of the present disclosure. As used herein, a memory device 103, a memory array 110, and/or a host 102, for example, might also be separately considered an "apparatus."

In this example, system 100 includes a host 102 coupled to memory device 103 via an interface 104. The computing system 100 can be a personal laptop computer, a desktop computer, a digital camera, a mobile telephone, a memory card reader, or an Internet-of-Things (IoT) enabled device, among various other types of systems. Host 102 can include a number of processing resources (e.g., one or more processors, microprocessors, or some other type of controlling circuitry) capable of accessing memory 120. The system 100 can include separate integrated circuits, or both the host 102 and the memory device 103 can be on the same integrated circuit. For example, the host 102 may be a system controller of a memory system comprising multiple memory devices 103, with the system controller 102 providing access to the respective memory devices 103 by another processing resource such as a central processing unit (CPU).

In the example shown in FIG. 1, the host 102 is responsible for executing an operating system (OS) and/or various applications (e.g., processes) that can be loaded thereto (e.g., from memory device 103 via controller 105). The OS and/or various applications can be loaded from the memory device 103 by providing access commands from the host 102 to the memory device 103 to access the data comprising the OS and/or the various applications. The host 102 can also access data utilized by the OS and/or various applications by providing access commands to the memory device 103 to retrieve said data utilized in the execution of the OS and/or the various applications.

For clarity, the system 100 has been simplified to focus on features with particular relevance to the present disclosure. The memory array 110 can be a DRAM array, SRAM array, STT RAM array, PCRAM array, TRAM array, RRAM array, NAND flash array, and/or NOR flash array, for instance. For example, the memory array 110 can be an unshielded DL 4F2 array such as a 3D-DRAM memory array. The array 110 can comprise memory cells arranged in rows coupled by word lines (which may be referred to herein as access lines or select lines) and columns coupled by digit lines (which may be referred to herein as sense lines or data lines). Although a single array 110 is shown in FIG. 1, embodiments are not so limited. For instance, memory device 103 may include a number of arrays 110 (e.g., a number of banks of DRAM cells).

The memory device 103 includes address circuitry 106 to latch address signals provided over an interface 104. The interface can include, for example, a physical interface employing a suitable protocol (e.g., a data bus, an address bus, and a command bus, or a combined data/address/command bus). Such protocol may be custom or proprietary, or the interface 104 may employ a standardized protocol, such as Peripheral Component Interconnect Express (PCIe), Gen-Z, CCIX, or the like. Address signals are received and decoded by a row decoder 108 and a column decoder 112 to access the memory array 110. Data can be read from memory array 110 by sensing voltage and/or current changes on the sense lines using sensing circuitry 111. The sensing circuitry 111 can comprise, for example, sense amplifiers that can read and latch a page (e.g., row) of data from the memory array 110. The I/O circuitry 107 can be used for bi-directional data communication with the host 102 over the interface 104. The read/write circuitry 113 is used to write data to the memory array 110 or read data from the memory array 110. As an example, the circuitry 113 can comprise various drivers, latch circuitry, etc.

Control circuitry 105 decodes signals provided by the host 102. The signals can be commands provided by the host 102. These signals can include chip enable signals, write enable signals, and address latch signals that are used to control operations performed on the memory array 110, including data read operations, data write operations, and data erase operations. In various embodiments, the control circuitry 105 is responsible for executing instructions from the host 102. The control circuitry 105 can comprise a state machine, a sequencer, and/or some other type of control circuitry, which may be implemented in the form of hardware, firmware, or software, or any combination of the three. In some examples, the host 102 can be a controller external to the memory device 103. For example, the host 102 can be a memory controller which is coupled to a processing resource of a computing device.

The memory device 103 can also include a plurality of switches 114. The switches 114 can be coupled to the memory arrays 110. The switches 114 can include a conductive path that can be enabled or disabled. The switches can make or brake an electrical circuit based on the activation or deactivation of a switch. The switches 114 can be utilized to introduce noise from a digit line of a first memory array to a second digit line of a second memory array from the memory arrays 110.

Figure 2:
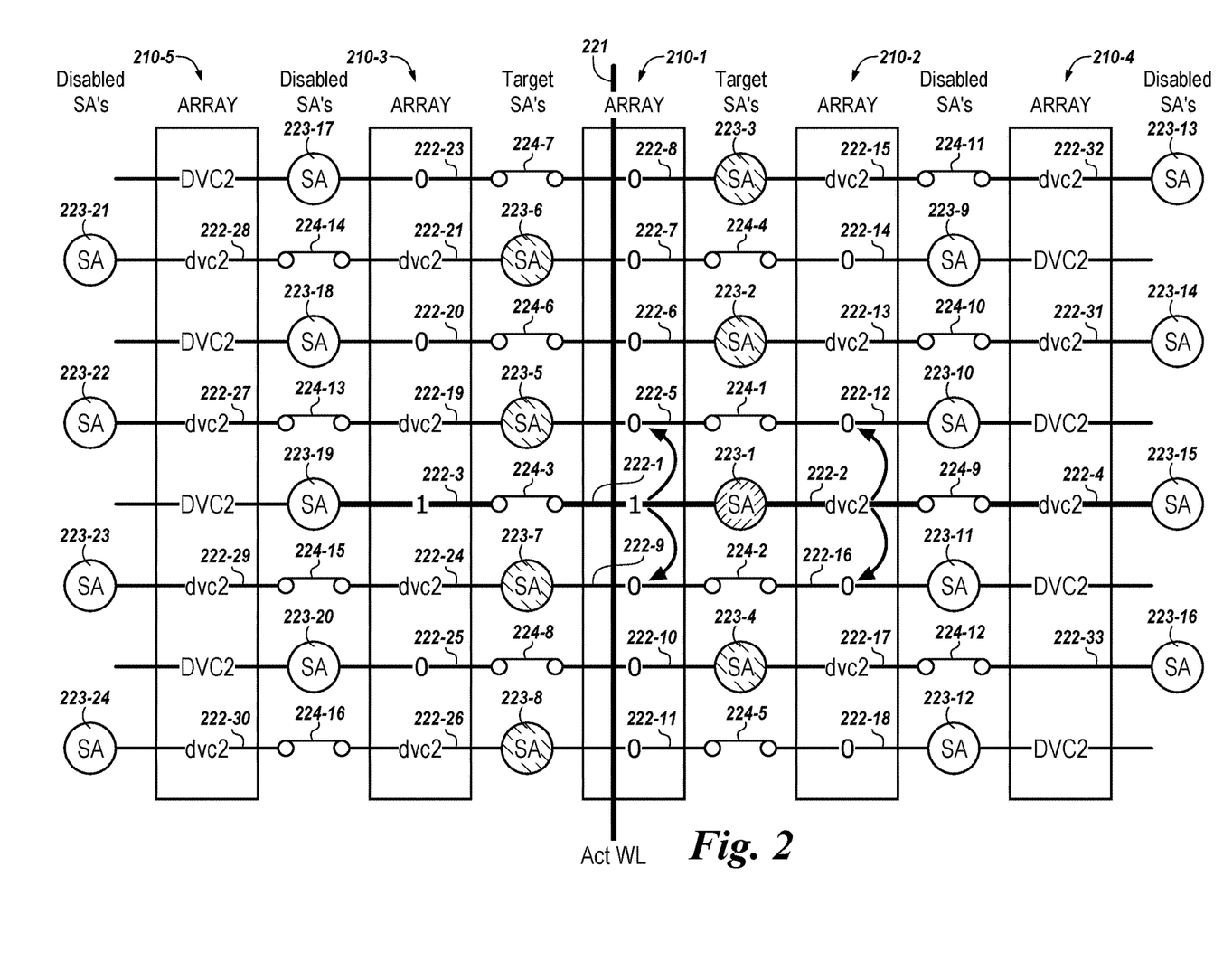
FIG. 2 is a block diagram of a plurality of memory arrays coupled through a plurality of switches in accordance with a number of embodiments of the present disclosure.

FIG. 2 is a block diagram of a plurality of memory arrays coupled through a plurality of switches in accordance with a number of embodiments of the present disclosure. FIG. 2 includes the memory arrays 210-1, 210-2, 210-3, 210-4, and 210-5, the sense amplifiers 223-1 to 223-24, and the switches 224-1 to 224-16. The memory arrays 210-1 to 210-5 can be referred to as memory arrays 210, the sense amplifiers 223-1 to 223-24 can be referred to as sense amplifiers 223, and the switches 224-1 to 224-16 can be referred to as switches 224.

Each of the memory arrays 210 can be comprise of a plurality of word lines and a plurality of digit lines. For example, the memory array 210-1 comprises a word line 221 and a digit line 222-1. Each of the memory arrays 210 can comprise a plurality of memory cells coupled to the word lines and the digit lines. For example, a memory cell can be coupled to the word line 221 and the digit line 222-1. Enabling the word line 221 and the digit line 222-1 can enable the memory cell coupled to the word line 221 and the digit line 222-1 to transfer the charge stored in the memory cell to the digit line 222-1.

The memory cell coupled to the word line 221 and the digit line 222-1 stores a charge representative of a "1" bit. The other memory cells coupled to the word line 221 and adjacent digit lines 222-5, 222-6,222-7, 222-8, 222-9, 222-10, and 222-11, store a charge representative of a "0" bit. This configuration of stored charges may be referred to as a one is a sea of zeroes (1c0) pattern and may cause the digit line 222-1 and/or the digit lines 222-5 to 222-11 to move at dump time. As used herein, dump time refers to a point at which a word line is fired/activated. Firing/activating a word line can turn on the access transistors such that the charge stored in the capacitors of memory cells coupled to the word line is "dumped" onto the digit line. The reference digit lines can be biased at Vcc/2. Sense time refers to the firing of the sense amplifiers to amplify the differential signal between the digit lines and the reference digit lines.

The digit line to digit line coupling between the digit lines 222-5 to 222-11 and the digit line 222-1 may cause the voltage (e.g., "1" bit) provided by the memory cell coupled to the digit line 222-1 and the word line 221 to be pulled lower by the voltage stored in the memory cells coupled to the digit lines 222-5 to 222-11 (e.g., "0" bits). The noise experienced by the digit line 222-1, in the example provided in FIG. 2, is due to a loss of charge. As a result, the signal available to the sense amplifier 223-1 and generally to the sense amplifiers 223 may be degraded.

The memory cells coupled to the word line 221 and adjacent digit lines 222-5 to 222-11 can also experience noise due to the digit line to digit line coupling. The noise experienced by the adjacent digit lines 222-5 to 222-11 can be caused by a charge gain. For example, the adjacent digit lines 222-5 to 222-11 can hold a voltage that represents a "0" bit. The voltage that represents a "0" bit may be supplemented due to the digit line to digit line coupling experienced with the digit line 222-1.

To counter the noise introduced to the digit line 222-1 and the digit lines 222-5 to 222-11. The switches 224-1 to 224-8 can be enabled. Enabling the switch 224-1 can couple the digit line 222-5 to the digit line 222-12. Enabling the switch 224-2 can couple the digit line 222-9 to the digit line 222-16. Enabling the switch 224-3 can couple the digit line 222-1 to the digit line 222-3. Enabling the switch 224-4 can couple the digit line 222-7 to the digit line 222-14. Enabling the switch 224-5 can couple the digit line 222-11 to the digit line 222-18. Enabling the switch 224-6 can couple the digit line 222-6 to the digit line 222-20. Activating the switch 224-7 can couple the digit line 222-8 to the digit line 222-23. Activating the switch 224-8 can couple the digit line 222-11 to the digit line 222-26. Coupling the digit line 222-1 to 222-3, the digit line 222-5 to the digit line 222-12, the digit line 222-6 to the digit line 222-20, the digit line 222-7 to the digit line 222-14, the digit line 222-8 to the digit line 222-23, the digit line 222-9 to the digit line 222-16, the digit line 222-10 to the digit line 222-25, and the digit line 222-11 to the digit line 222-18 can provide for the voltage held by the digit lines 222-1 and 222-5 to 11 to be introduced into the digit lines 222-3, 222-12, 222-20, 222-14, 222-23, 222-16, 222-25, and 222-18, respectively.

For example, the switch 224-1 can couple the digit line 222-5 to the digit line 222-12. The voltages held by the digit lines 222-5 and 222-12 can introduce noise to the digit lines 222-1 and 222-2 such that the noise introduced to the digit line 222-1 is countered by introducing the same noise to the digit line 222-2. The digit line 222-2 can also be referred to as a reference digit line 222-2. The digit line 222-2 can provide a reference voltage that is used to amplify the voltage provided by the digit line 222-1. The reference voltage is shown in FIG. 2 as "dvc2" which represents a floating reference voltage. The reference voltage is floating due to the noise introduced by the digit line to digit line coupling effect experience from one or more of the digit lines 222-12, 222-14, 222-15, 222-16, and 222-18. FIG. 2 also shows reference voltages labeled as "DVC2" which represent reference voltages that are not floating. Floating describes the deviation of a voltage and/or charge from an expected voltage and/or charge. For instance, the reference voltage can be set to DVC2 but can float responsive to experiencing digit line to digit line coupling effect. Responsive to experiencing a digit line to digit line coupling effect, a voltage previously labeled DVC2 can be labeled as dvc2 therewith.

The other reference digit lines (e.g., digit lines 222-13, 222-15, 222-17, 222-19, 222-21, 222-24, and 222-26) can also float due to the experienced digit line to digit line coupling. The switches between the memory arrays 210-1, 210-2, and 210-3 can be enabled to counter the digit line to digit line coupling. The switches between the memory arrays 210-2 and 210-4 and the memory arrays 210-3 and 210-5 can also be enabled to counter the digit line to digit line coupling effect experience by the digit lines 222-1 to 222-26.

Figure 3:
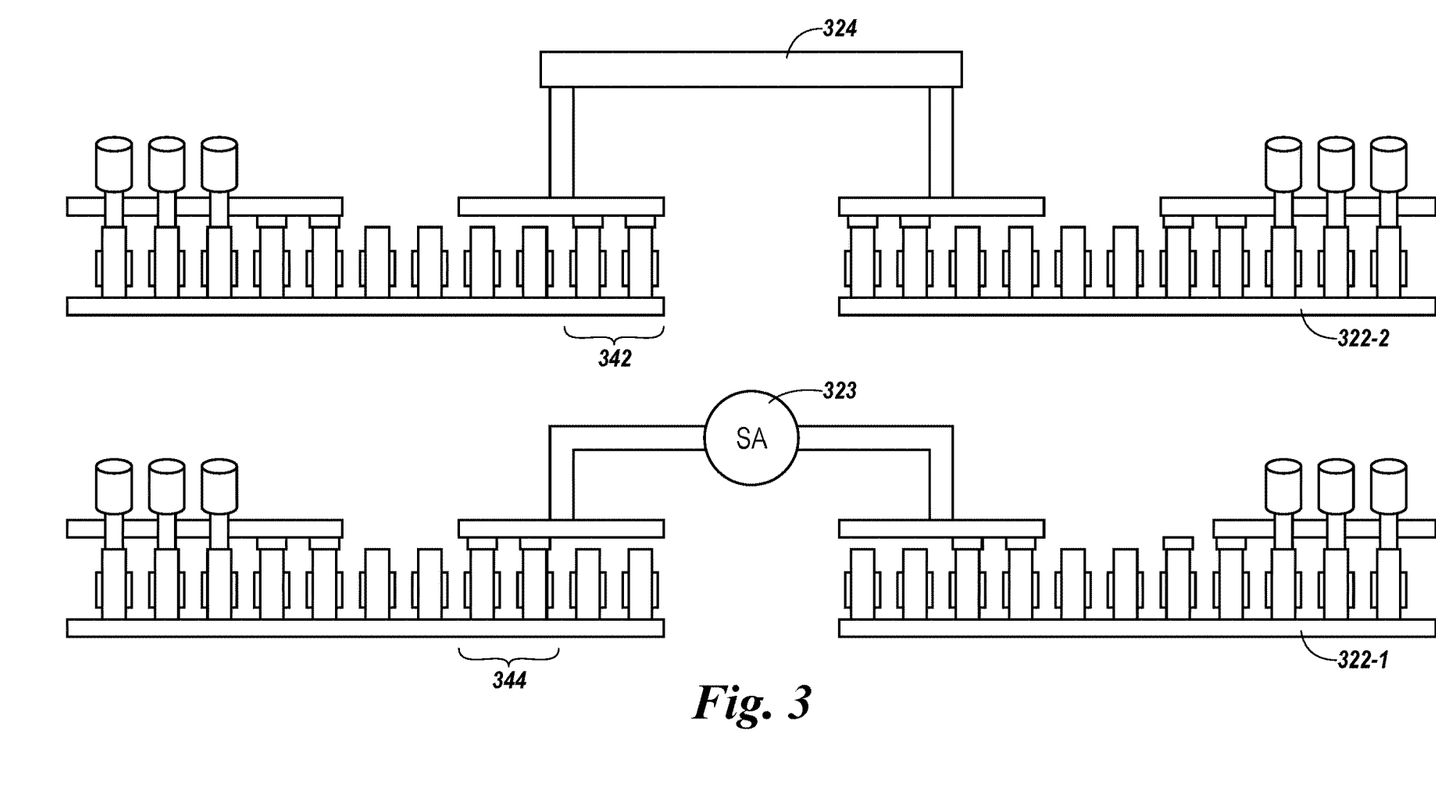
FIG. 3 is a block diagram of a switch and a sense amplifier in accordance with a number of embodiments of the present disclosure.

FIG. 3 is a block diagram of a switch 324 and a sense amplifier 323 in accordance with a number of embodiments of the present disclosure. The switch 324 and the sense amplifier 323 are analogous to the switches 224 and sense amplifiers 223 in FIG. 2.

The switch 324 and the sense amplifier 323 can be coupled to the digit lines 322-2 and 322-1, respectively. The switch 324 and the sense amplifier 323 can be enabled utilizing devices 342 and 344 respectively. The switches including the switch 324 can alternate digit lines with the sense amplifiers including the sense amplifier 323. The devices 342 and 344 can be controlled by control circuitry to enable the switch 324 and/or the sense amplifier 323. The devices 342 can be enabled concurrently with the device 344. For example, the device 342 can be enabled at a first time and the device 342 can remain enabled while the device 344 is enabled at a second time. In various examples, the device 342 is enabled and disabled prior to the enablement of the device 344.

Although FIG. 3 shows the switch 324 and the sense amplifier 323 as being above the array, the switch 324 and the sense amplifier 323 can be implemented under one or more memory arrays.

Figure 4:
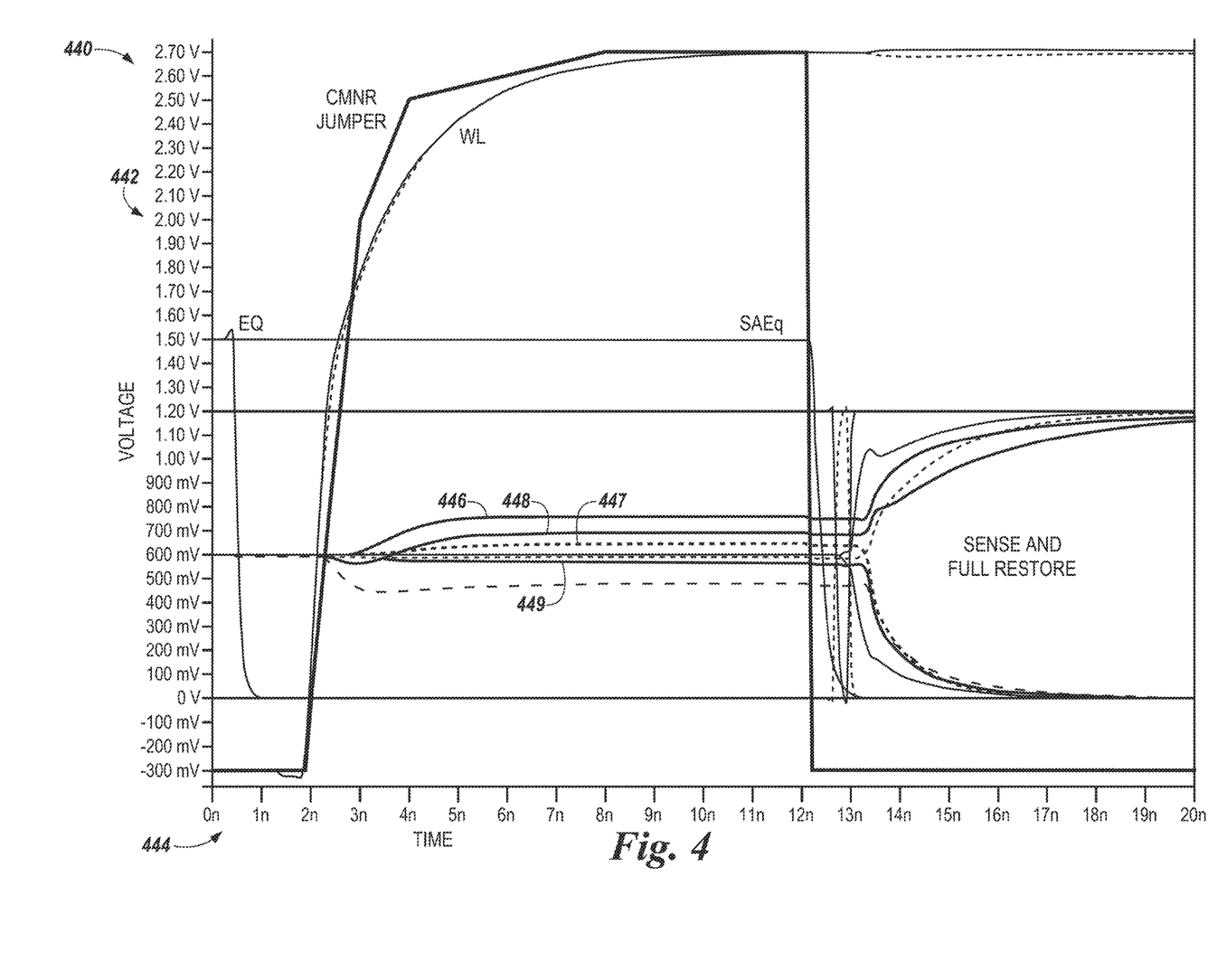
FIG. 4 is a graph illustrating digit line waveforms in accordance with a number of embodiments of the present disclosure.

FIG. 4 is a graph 440 illustrating digit line waveforms in accordance with a number of embodiments of the present disclosure. The graph 440 is provided with regards to a voltage axis 442 and a time axis 444. The voltage 446 represents a voltage representing a "1" bit that is held by a first digit line which experiences digit line to digit line coupling with digit lines that also hold voltages representing a "1" bit. Said voltage pattern can be described as a one in a sea of ones (1C1).

The voltage 447 represents a reference voltage corresponding to the voltage 446. The voltage 447 can be held by a first reference digit line corresponding to the first digit line that holds the voltage 446. The first reference digit line also experiences a digit line to digit line coupling of a same magnitude as experienced by the first digit line.

The voltage 448 represents a voltage representing a "1" bit that is held by a second digit line which experiences digit line to digit line coupling with digit lines that hold voltages representing a "0" bit. Said voltage pattern was previously described as a 1C0. The voltage 449 represents a reference voltage corresponding to the voltage 448. The voltage 449 can be held by a second reference digit line corresponding to the second digit line that holds the voltage 448. The second reference digit line also experiences a digit line to digit line coupling of a same magnitude as experienced by the second digit line.

As shown in FIG. 4, the voltage 449 is lower than a reference voltage that has not experienced digit line to digit line coupling. The voltage 447 is greater than a reference voltage that has not experienced digit line to digit line coupling. However, the difference between the voltage 446 and the voltage 447 is equal to the difference between the voltage 448 and the voltage 449. Preserving the voltage difference between a voltage corresponding to a 1C0 or a 1C1 and its corresponding reference voltage can provide for accurate function of the sense amplifiers.

Figure 5:
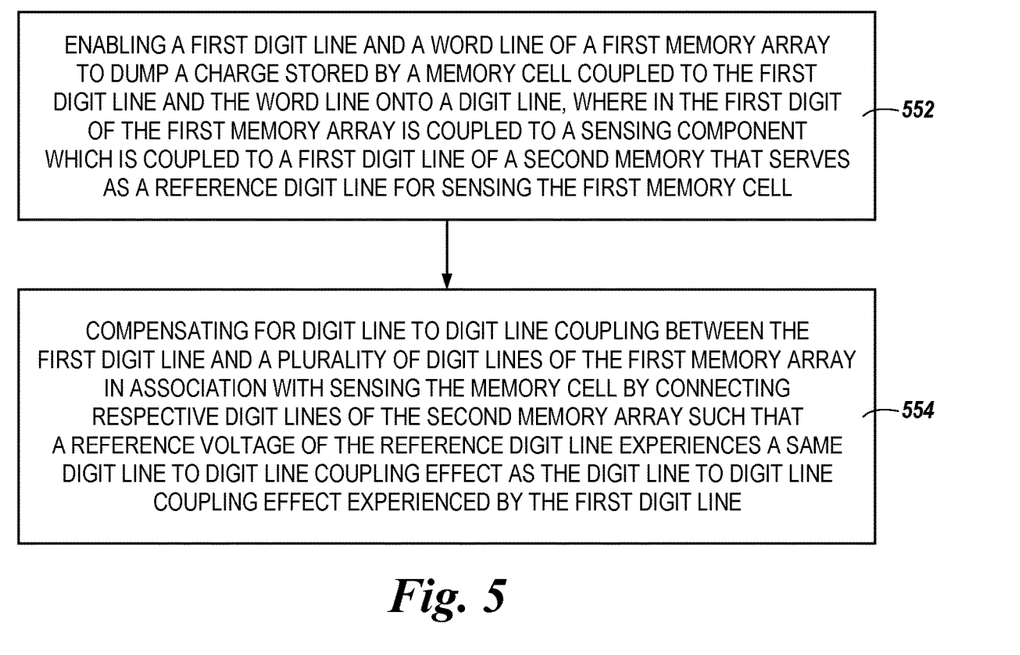
FIG. 5 illustrates an example flow diagram of a method for countering noise in a memory array in accordance with a number of embodiments of the present disclosure.

FIG. 5 illustrates an example flow diagram of a method for performing speculation in memory in accordance with a number of embodiments of the present disclosure. At 552, the method can include enabling a first digit line and a word line of a first memory array to dump a charge stored by a memory cell coupled to the first digit line and the word line onto the first digit line, where the first digit line of the first memory array is coupled to a sensing component (e.g., sense amplifier) which is coupled to a first digit line of a second memory array that serves as a reference digit line for sensing the first memory cell.

At 554, the method can also include compensating for digit line to digit line coupling between the first digit line and a plurality of digit lines of the first memory array in association with sensing the memory cell by connecting the plurality digit lines of the first memory array to corresponding respective digit lines of the second memory array such that a reference voltage of the reference digit line experiences a same digit line to digit line coupling effect as the digit line to digit line coupling effect experienced by the first digit line.

The digit line to digit line coupling effect experienced by the reference digit line is of a same magnitude as the digit line to digit line coupling effect experienced by the first digit line. The magnitude of the digit line to digit line coupling effect is the same because the magnitude is based on a same voltage held by digit lines adjacent to the reference digit line and the first digit line. The digit lines adjacent to the reference digit line and the digit lines adjacent to the first digit line hold a same voltage because the voltage is transferred from the digit lines adjacent to the first digit line to the digit lines adjacent to the reference digit lines via a plurality of switches.

In some examples the plurality of digit lines can be adjacent to the first digit line or non-adjacent to the first digit line. For example, the digit line to digit line coupling effect can be experienced with adjacent digit lines and/or non-adjacent digit lines.

The digit line to digit line coupling effect experienced by the first digit line and the reference digit line can be a result of connecting the plurality of digit lines to the corresponding respective digit lines by introducing voltages held by the plurality of digit lines into the corresponding respective digit lines via the switches. In some examples, the digit line to digit line effect can be proportional to the voltages held by the plurality of digit lines.

In various instances, a method for countering noise can include enabling a first plurality of digit lines and a second plurality of digit lines of the first memory array, where the first plurality of digit lines and the second plurality of digit lines experience a digit line to digit line coupling effect. Countering noise can further include enabling the first plurality of switches to introduce a first plurality of voltages held by the first plurality of digit lines to a third plurality of digit lines of the second memory array, where a first plurality of reference digit lines of the second memory array experience the digit line to digit line coupling effect from the first plurality of voltages held by the third plurality of digit lines.

Countering noise can also include enabling the second plurality of switches to introduce a second plurality of voltages held by the second plurality of digit lines to a fourth plurality of digit lines of the third memory array, wherein a second plurality of reference digit lines of the third memory array experience the digit line to digit line coupling effect from the second plurality of voltages held by the fourth plurality of digit lines.

Noise can be countered at a plurality of sense amplifiers by providing noise to a plurality of reference digit lines. The noise can be introduced to the plurality of reference digit lines at a same time. The noise experienced by plurality of reference digit lines can differ from digit line to digit line. For example, a first reference digit line can experience a first magnitude of noise while a second reference digit line can experience a second magnitude of noise even though the first magnitude of noise and the second magnitude of noise are introduced at a same time to the first reference digit line and the second reference digit line. The noise experienced by different reference digit lines can differ because the voltages held by adjacent digit lines to the reference digit lines can differ.

In various examples, the first plurality of switches and the second plurality of switches can be implemented under the first memory array, the second memory array, and/or the third memory array. In various instances a first sensing circuitry can be implemented to latch the first plurality of voltages utilizing a plurality of reference voltages held by the first plurality of reference digit lines that experienced the digit line to digit line coupling effect and a second sensing circuitry can also be implemented to latch the second plurality of voltages utilizing a second plurality of reference voltages held by the second plurality of reference digit lines that experienced the digit line to digit line coupling effect.

Figure 6:
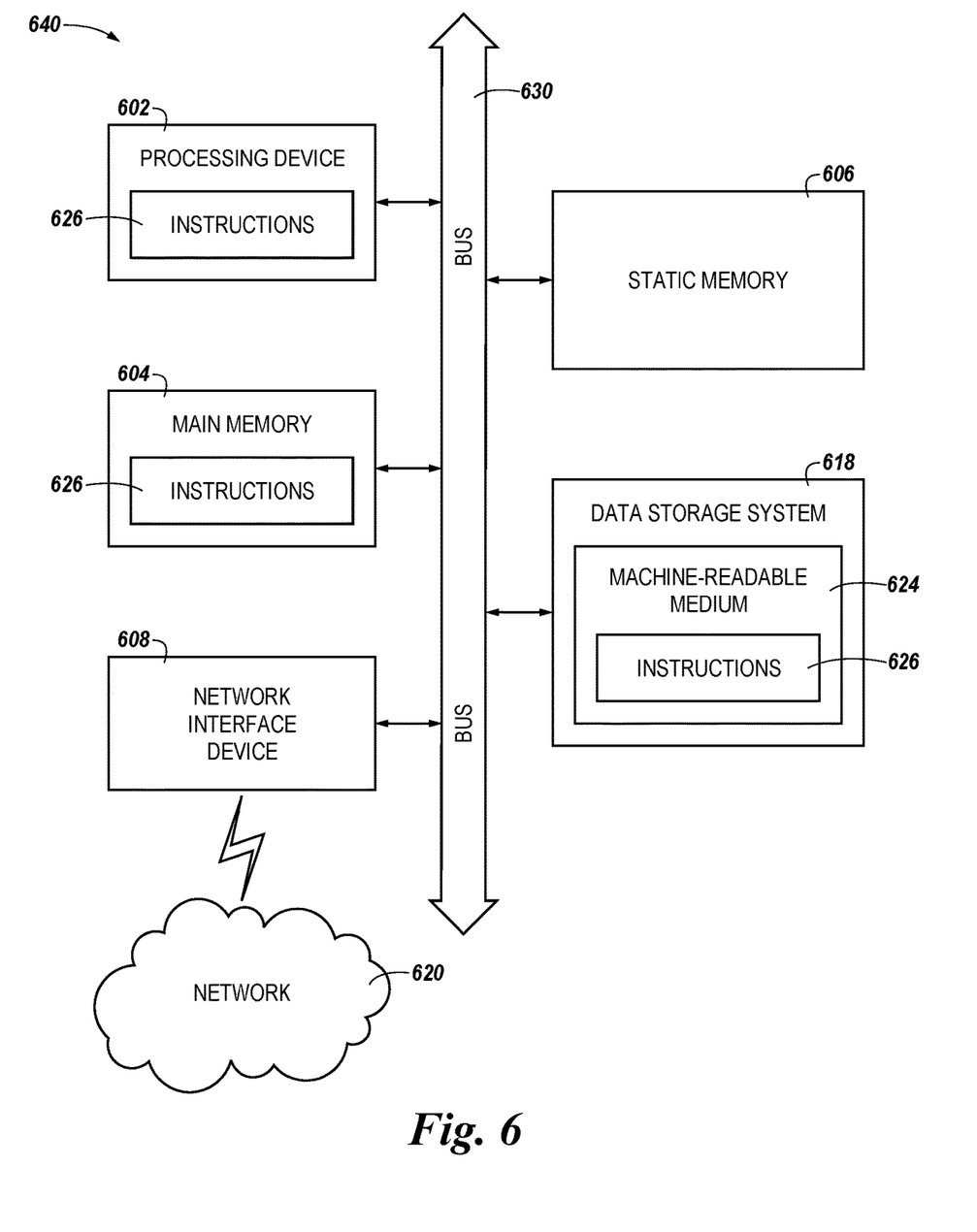
FIG. 6 illustrates an example machine of a computer system within which a set of instructions, for causing the machine to perform various methodologies discussed herein, can be executed.

FIG. 6 illustrates an example machine of a computer system 640 within which a set of instructions, for causing the machine to perform various methodologies discussed herein, can be executed. In various embodiments, the computer system 640 can correspond to a system (e.g., the system 100 of FIG. 1) that includes, is coupled to, or utilizes a memory sub-system (e.g., the memory device 103 of FIG. 1) or can be used to perform the operations of a controller (e.g., the controller 105 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 640 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 640 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 640, the main memory 604 and the processing device 602 also constituting machine-readable storage media.

In one embodiment, the instructions 626 include instructions to implement functionality corresponding to the host 102 and/or the memory device 103 of FIG. 1. While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combinations of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
sensing components coupled to respective first digit lines of a first array of memory cells and to respective second digit lines of a second array of memory cells, wherein the respective second digit lines serve as reference digit lines for sensing memory cells of the first array; and
control circuitry coupled to the sensing components and configured to, in association with sensing data values stored in memory cells coupled to a word line and to the respective first digit lines:
enable switches to connect third digit lines of the first array adjacent to the respective first digit lines to fourth digit lines of the second array adjacent to the reference digit lines such that the reference digit lines experience a same amount of digit line coupling noise as the first digit lines experience.

2. The apparatus of claim 1, wherein the control circuitry is further configured to enable the first digit lines and the word line of the first memory array to enable the memory cells coupled to the first digit lines and the word line.

3. The apparatus of claim 2, wherein the control circuitry is further configured to enable the memory cells coupled to the first digit lines and the word line to dump a voltage stored in the memory cells to the first digit lines.

4. The apparatus of claim 2, wherein the control circuitry configured to enable the first digit lines is further configured to provide for digit line to digit line coupling of the first digit lines and the third digit lines of the first memory array.

5. The apparatus of claim 4, wherein the control circuitry configured to provide for the coupling of the first digit lines and the third digit lines is further configured to introduce noise to the first digit lines through the coupling of the first digit lines to the third digit lines.

6. The apparatus of claim 4, wherein the control circuitry is further configured to enable the second digit lines to provide reference voltages to the sensing components.

7. The apparatus of claim 6, wherein the control circuitry configured to enable the switches provides for the digit line to digit line coupling of the fourth digit lines and the second digit lines which introduces the noise to the second digit lines.

8. The apparatus of claim 1, wherein the control circuitry is configured to enable the switch switches at dump time.

9. The apparatus of claim 8, wherein the control circuitry is configured to disable the switches prior to activating the sensing components.

10. The apparatus of claim 8, wherein the control circuitry is configured to enable the switches at sense time.

11. A method, comprising:
enabling a first digit line and a word line of a first memory array to dump a charge stored by a memory cell coupled to the first digit line and the word line onto the first digit line, wherein the first digit line of the first memory array is coupled to a sensing component which is coupled to a first digit line of a second memory array that serves as a reference digit line for sensing the first memory cell; and
compensating for digit line to digit line coupling between the first digit line and a plurality of digit lines of the first memory array in association with sensing the memory cell by:
connecting the plurality digit lines of the first memory array to corresponding respective digit lines of the second memory array such that a reference voltage of the reference digit line experiences a same digit line to digit line coupling effect as the digit line to digit line coupling effect experienced by the first digit line.

12. The method of claim 11, wherein the digit line to digit line coupling effect experienced by the reference digit line is of a same magnitude as the digit line to digit line coupling effect experienced by the first digit line.

13. The method of claim 11, wherein the plurality of digit lines are adjacent to the first digit line.

14. The method of claim 11, wherein the plurality of digit lines are non-adjacent to the first digit line.

15. The method of claim 11, further comprising connecting the plurality of digit lines with the corresponding respective digit lines via a plurality of switches.

16. The method of claim 15, wherein connecting the plurality of digit lines further comprises introducing voltages held by the plurality of digit lines into the corresponding respective digit lines via the plurality of switches.

17. The method of claim 16, wherein the digit line to digit line coupling effect is proportional to the voltages held by the plurality of digit lines.

18. An apparatus, comprising:
a first memory array, a second memory array, and a third memory array;
a first plurality of switches;
a second plurality of switches;
control circuitry, coupled to the first memory array, the second memory array, the third memory array, the first plurality of switches, and the second plurality of switches, and configured to:
enable a first plurality of digit lines and a second plurality of digit lines of the first memory array, wherein the first plurality of digit lines and the second plurality of digit lines experience a digit line to digit line coupling effect;
enable the first plurality of switches to introduce a first plurality of voltages held by the first plurality of digit lines to a third plurality of digit lines of the second memory array, wherein a first plurality of reference digit lines of the second memory array experience the digit line to digit line coupling effect from the first plurality of voltages held by the third plurality of digit lines; and
enable the second plurality of switches to introduce a second plurality of voltages held by the second plurality of digit lines to a fourth plurality of digit lines of the third memory array, wherein a second plurality of reference digit lines of the third memory array experience the digit line to digit line coupling effect from the second plurality of voltages held by the fourth plurality of digit lines.

19. The apparatus of claim 18, wherein the first plurality of switches and the second plurality of switches are under the first memory array, the second memory array, and the third memory array.

20. The apparatus of claim 18, wherein the control circuitry is further configured to cause:
a first sensing circuitry to latch the first plurality of voltages utilizing a plurality of reference voltages held by the first plurality of reference digit lines that experienced the digit line to digit line coupling effect; and
a second sensing circuitry to latch the second plurality of voltages utilizing a second plurality of reference voltages held by the second plurality of reference digit lines that experienced the digit line to digit line coupling effect.

* * * * *